United States Patent
Fretheim et al.

(10) Patent No.: US 12,300,978 B2
(45) Date of Patent: May 13, 2025

(54) SUBSEA SUBSTATION SYSTEM WITH ONE ENCLOSURE HAVING SEPARATE THERMAL ZONES

(71) Applicant: ABB Schweiz AG, Baden (CH)

(72) Inventors: Harald Fretheim, Aurskog (NO); Oistein Martinsen, Bærums Verk (NO); Stian Ingebrigtsen, Bergen (NO); Vitor Hugo Eiti Moritsugu, Bergen (NO)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 18/718,115

(22) PCT Filed: Nov. 15, 2022

(86) PCT No.: PCT/EP2022/081975
§ 371 (c)(1),
(2) Date: Jun. 10, 2024

(87) PCT Pub. No.: WO2023/110262
PCT Pub. Date: Jun. 22, 2023

(65) Prior Publication Data
US 2024/0421568 A1   Dec. 19, 2024

(30) Foreign Application Priority Data
Dec. 13, 2021   (EP) .................................... 21214086

(51) Int. Cl.
*H02B 1/56*   (2006.01)
*H01F 27/02*   (2006.01)
(Continued)

(52) U.S. Cl.
CPC ............. *H02B 1/56* (2013.01); *H01F 27/025* (2013.01); *H02B 7/06* (2013.01); *H02J 3/38* (2013.01);
(Continued)

(58) Field of Classification Search
CPC ........ H02B 7/06; H02B 1/56; H05K 7/20236; H05K 9/0001; H02J 3/38
See application file for complete search history.

(56) References Cited

U.S. PATENT DOCUMENTS 8,251,614 B2 *   8/2012   Karstad ............... E21B 33/0385
                                                     405/193
9,203,218 B2 *  12/2015   Boe .......................... H02B 7/00
(Continued)

FOREIGN PATENT DOCUMENTS

EP         981140 A1    2/2000
EP        2717401 A1    4/2014

OTHER PUBLICATIONS

Extended European Search Report; Application No. 21214086.7; Completed: May 27, 2022; Mailed: Jun. 10, 2022; 14 Pages.
(Continued)

*Primary Examiner* — Zachary Pape
(74) *Attorney, Agent, or Firm* — Whitmyer IP Group LLC

(57) ABSTRACT

A subsea substation system including: an oil-filled water impermeable enclosure; an AC-transformer, and at least one overcurrent device electrically connected to the AC-transformer, the at least one overcurrent device, the AC-transformer, and the electrical connections between them are accommodated in the oil-filled water impermeable enclosure, wherein the enclosure includes thermal zones within the enclosure, wherein the AC-transformer is arranged in a first thermal zone and the overcurrent devices are arranged in a second thermal zone of the enclosure, a thermal layer separate the first thermal zone and the second thermal zone, the at least one thermal layer is configured to allow oil flow between the thermal zones while reducing heat flow between the zones.

20 Claims, 10 Drawing Sheets

(51) Int. Cl.
  *H01F 27/12* (2006.01)
  *H02B 7/06* (2006.01)
  *H02J 3/38* (2006.01)
  *H05K 7/20* (2006.01)
  *H05K 9/00* (2006.01)

(52) U.S. Cl.
  CPC ......... *H05K 7/20236* (2013.01); *H01F 27/12* (2013.01); *H05K 9/0001* (2013.01)

(56) References Cited

U.S. PATENT DOCUMENTS

| 2009/0226262 | A1 | 9/2009 | Karstad et al. |
| 2017/0104329 | A1 | 4/2017 | Boe |
| 2017/0141548 | A1 | 5/2017 | Strmsvik |

OTHER PUBLICATIONS

International Preliminary Report on Patentabilty; Application No. PCT/EP2022/081975; Completed: Oct. 16, 2023; 17 Pages.

The International Search Report and Written Opinion of the International Searching Authority; Application No. PCT/EP2022/081975; Completed: Jan. 23, 2023; Mailing Date: Feb. 21, 2023; 14 Pages.

* cited by examiner

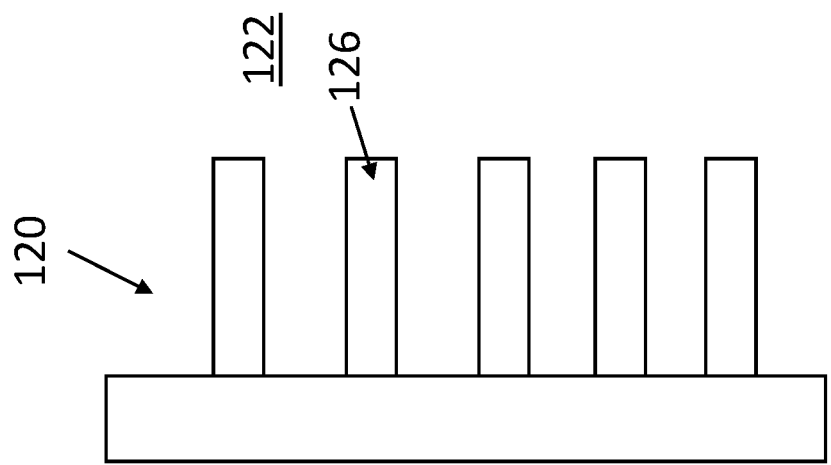
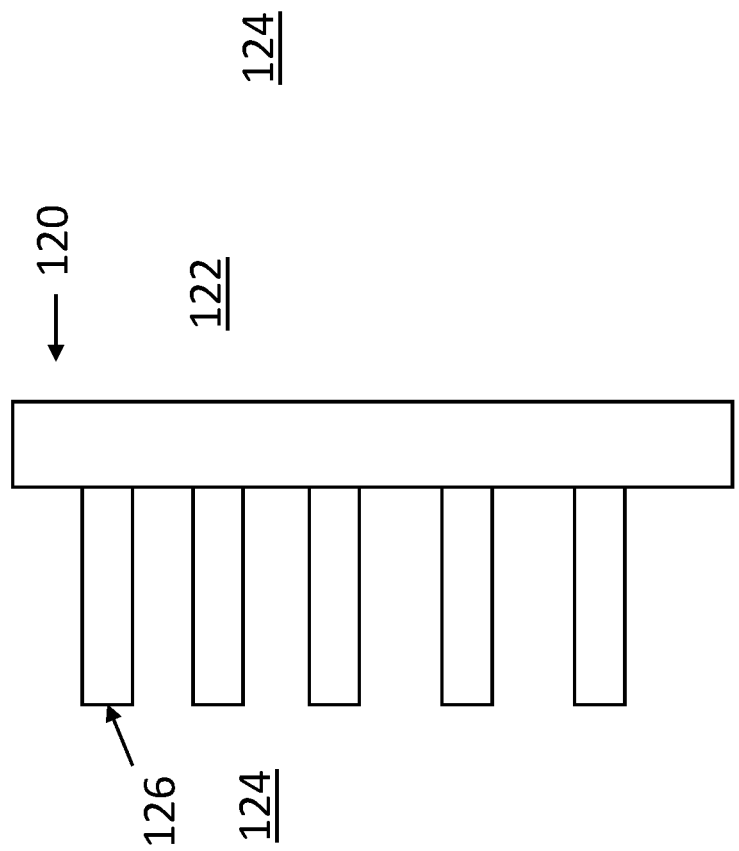
Fig. 5A
Fig. 5B

SUBSEA SUBSTATION SYSTEM WITH ONE ENCLOSURE HAVING SEPARATE THERMAL ZONES

TECHNICAL FIELD

The present invention relates to a subsea substation system. The present invention further relates to a power collection system for subsea collection of power from power generation units, the power collection system comprising at least one subsea substation system.

BACKGROUND

Offshore power generation installations such as for example windmills, solar power devices, and wave generated power, has over recent years increased both in size and rated power. The ongoing size and power increase with associated developments leads to logistic challenges with regards to installation and maintenance, in addition to the challenges related to power collection from the respective power generating installations.

With floating wind turbines, or other floating power generation installations, such as for example floating solar power, logistics in installation and power collection and, when relevant, distribution, is challenging. For example, presently used power export cables are often not sufficiently strong for withstanding forces for utilizing floating substations connected to the power generation installations.

To alleviate this problem, electrical power systems for subsea operation has been proposed. However, there appears to still be room for improvements for such subsea electrical power system.

SUMMARY

In view of the above-mentioned and other drawbacks of the prior art, it is an object of the present invention to provide a subsea substation system that at least partly alleviates the deficiencies with prior art.

According to a first aspect of the invention, there is provided a subsea substation system comprising an oil-filled water impermeable enclosure; an AC-transformer, and at least one overcurrent device electrically connected to the AC-transformer. The at least one overcurrent device, the AC-transformer, and the electrical connections between them are accommodated in the oil-filled water impermeable enclosure. The enclosure comprises thermal zones within the enclosure, wherein the AC-transformer is arranged in a first thermal zone and the overcurrent devices are arranged in a second thermal zone of the enclosure. At least one thermal layer separates the first thermal zone and the second thermal zone, the at least one thermal layer is configured to allow oil flow between the thermal zones while reducing heat flow between the zones.

The present invention is at least partly based on the realization that a more compact subsea substation is provided if the AC-transformer and the overcurrent devices are arranged in the same enclosure. Further, flow of the oil within the enclosure is mainly due to convection which reduces the complexity and cost of subsea substations since other flow-forcing equipment may be avoided. Still further, using a single enclosure reduces, or even eliminates the need for complicated connectors between different enclosures which improves system operation reliability. Further, using a single enclosure may reduce the overall footprint of the system and may simplify oil-filling.

AC-transformers and overcurrent devices generally have different thermal operation characteristics and requirements, for example an AC-transformer would normally get much warmer than an overcurrent device. Arrangement of the AC-transformer and the at least one overcurrent device in the same enclosure is alleviated by the different thermal zones. By arranging the AC-transformer and the at least one overcurrent device in different thermal zones enables for operating them in the same enclosure despite different operation temperatures.

To enable the different thermal zones, the heated oil is guided towards the enclosure walls by design or thermal guides in the form of mechanical parts that guide the heated oil towards the enclosure walls away from the overcurrent devices. Thereby, the oil heated by the AC-transformer is at least partly prevented from reaching the overcurrent devices.

Preferably, a mechanical barrier is arranged in the enclosure configured to form a thermal layer. Such mechanical barrier is electrically insulating and is impregnated with the oil in the enclosure. Example mechanical barriers are made from e.g., pressboard or wood. In such case, one or more sheets or boards are placed between the first thermal zone and the second thermal zone as a barrier between the zones. Oil may flow between the zones, but this oil flow is sufficiently low to enable two different thermal zones. More specifically, the thermal layer, for example as provided by a mechanical barrier, does not form a sealing layer and is not sealed against the enclosure walls. In other words, in areas surrounding the plates, boards, or barriers, oil can still freely move between the thermal zones, but still allow for significantly reducing the overall thermal flow between the thermal zones. Thus, the enclosure forms a single volume that only requires a single oil-filling operation to fill both thermal zones with oil. The single volume includes the mechanical barrier the reduces the flow of hot oil between the thermal zones by guiding the hot oil towards the enclosure walls where it can exchange heat with water surrounding the enclosure, e.g., via heat dissipators.

Accordingly, with the proposed subsea substation system with the enclosure where the oil is allowed to flow while still making sure that heat created in a thermal zone does not substantially influence the other thermal zone, it is possible to arrange the AC-transformer and the overcurrent devices in the same enclosure.

That the substation system is a subsea substation system means that the subsea substation system is configured to be submersed in water during operation. In the submersed arrangement, the enclosure is entirely submersed in water, i.e., below sea level.

That the enclosure is oil-filled means that the enclosure is at least filled so that the AC-transformer and the overcurrent devices are submersed in oil and in contact with oil. There can still be some minor sub-volumes in the enclosure that is not oil-filled. However, the purpose while filling the enclosure with oil is to entirely fill the enclosure, but some pockets without oil are allowed. Preferably, the enclosure is entirely filled with oil.

The at least one overcurrent device is electrically connected to the AC-transformer means that the electrical power transfer, e.g., electrical current transmission, is possible between the AC-transformer and the at least one overcurrent device.

An AC-transformer is a device configured to transfer the voltage of an alternating current from a first voltage level to a second voltage level. That the enclosure is water-impermeable means that the enclosure is adapted to not allow water to enter the inner compartment of the enclosure where AC-transformer and the overcurrent devices are arranged. Preferably, the enclosure is metallic and completely welded to avoid water leakage into the enclosure. The enclosure is preferably made form a corrosive resistant metal.

In embodiments, the subsea substation system may further comprise at least one heat dissipator associated with at least one of the first and second thermal zones, the at least one heat dissipator is adapted to exchange heat with the surrounding water of the subsea substation system when being arranged at a subsea location. Generally, the at least one heat dissipator is adapted to increase the surface area exposed to water to dissipate heat from at least one of the thermal zones.

For example, pipes or other protruding hollow structures connected to walls of the enclosure may be used for increasing the surface area.

Thus, the at least one heat dissipator may be adapted to increase the surface area of a wall portion of the respective thermal zone of the enclosure. For example, the wall portion may be provided with a roughened surface or be provided with flanges or other structures on the inner side facing the compartment of the enclosure and/or on the outer wet side of the enclosure but aligned with a respective thermal zone.

Regardless of the specific configuration, the heat dissipators are adapted to reduce the heat transfer between thermal zones, and instead increase the heat exchange with the water outside the enclosure.

In embodiments, the first thermal zone may be located vertically from the second zone. Thus, arranging the AC-transformer with high temperature tolerance on top reduces the flow of heat therefrom to the bottom zone where the overcurrent devices are located.

In embodiments, the subsea substation system may comprise an electromagnetic shielding layer between the first thermal zone and the second thermal zone. This further alleviates using a single enclosure since the electromagnetic shielding layer can be adapted to allow for oil flow through it while at the same time reduce electromagnetic disturbance between the AC-transformer and the overcurrent devices. For example, breaking currents at the overcurrent devices may be negatively affected by the AC-transformer, or sensors of the overcurrent devices may be negatively affected by the AC-transformer. These effects can be reduced by the electromagnetic shielding layer between the first thermal zone and the second thermal zone.

An electromagnetic shielding layer may comprise of an electrically conductive mesh, such as a metallic mesh.

The AC-transformer is preferably operative at at least 6 kV AC at the low voltage side, i.e., the secondary side, and at at least 11 kV AC at the high voltage side being the primary side.

The at least one overcurrent device is preferably configured to operate at voltage levels of 6 kV to 250 kV and breaking high fault electrical currents of at least 16 kA.

The first thermal zone may be adapted for accommodating devices tolerating higher temperatures than what the second thermal zone is adapted for.

In embodiments, the AC-transformer may comprise at least one secondary winding each connected to at least one overcurrent device. In preferred embodiments, the AC-transformer comprises multiple secondary windings.

In embodiments, each overcurrent device may be equipped with sensors configured to detect faults and disconnect an electrical circuit associated with the overcurrent device. In other words, the overcurrent device is equipped with sensors that are able to detect various faults in the subsea substation system, or at external to the enclosure, and disconnect and protect the corresponding circuit. The sensors could be voltage, current, temperature, insulation measurement, water leakage. For specific loads the sensors could be installed as a single sensor or a pair of redundant sensors. This increases the system reliability since a single sensor failure would not mean losing the sensor functionality.

In embodiments, the subsea substation system may further comprise a control unit configured to receive signals from the sensors indicative of the faults, and to control the operation of the at least one overcurrent device in response the received signal. Thus, the control unit is configured to process sensing signals from the sensors and provide control signals to the at least one overcurrent device for opening or closing the at least one overcurrent device.

The control unit may be arranged in a separate secondary water impermeable enclosure so that the control unit is more easily retrievable. The second water impermeable enclosure is preferably oil-filled.

In embodiments, the subsea substation system may further comprise a communication arrangement configured to allow remote control of the control unit, and to acquire data indicative of the operation status of the AC-transformer and/or the overcurrent devices. Thus, the overcurrent devices are in this way possible to be remotely controlled, i.e., to be opened and closed, from on-shore or an off-shore surface level command center.

The AC-transformer and the at least one overcurrent device may be configured to operate in contact with oil.

The overcurrent device may comprise a magnetic actuator configured to control a connection to the AC-transformer. A magnetic actuator allows for fewer mechanical parts.

The subsea substation system may comprise wet-mated connectors on the outer side of the enclosure electrically connected to the AC-transformer and to the at least one overcurrent device. The wet-mated connectors allow electrical connection with an external electrical arrangement via a subsea cable. Alternatively, dry-mated connectors may be comprised in the system to allow for electrical connection with an external electrical arrangement via a subsea cable.

The subsea cable may be arranged on the seabed.

According to a second aspect of the invention, there is provided a power collection system for subsea collection of power from power generation units, the system comprising: at least one subsea substation system according to any one of the preceding claims, arranged subsea and connected with a at least one power generation unit to collect electrical power from the at least one power generation unit, the at least one subsea substation system being electrically connected with the power generation unit and being connected with a power consumer by at least one subsea cable.

The system comprises the at least one power generation unit and the subsea cable.

A power consumer may be an entity that receives power and distributes the power further, or a direct consumer of the power, or a power storage such as a battery.

A power generation unit may be e.g., floating windmills, e.g., comprising a wind turbine for converting wind power into electric power. However, it should be understood that the power generation units may equally well be e.g., floating solar power modules, or floating wave or tidal power modules arranged offshore in a floating formation, or an on-shore power station.

Further effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein:

FIG. 5A conceptually illustrates example heat dissipators according to embodiments of the invention;

FIG. 5B conceptually illustrates example heat dissipators according to embodiments of the invention;

DETAILED DESCRIPTION

In the present detailed description, various embodiments of the present invention are herein described with reference to specific implementations. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the scope of the invention.

Figure 1:
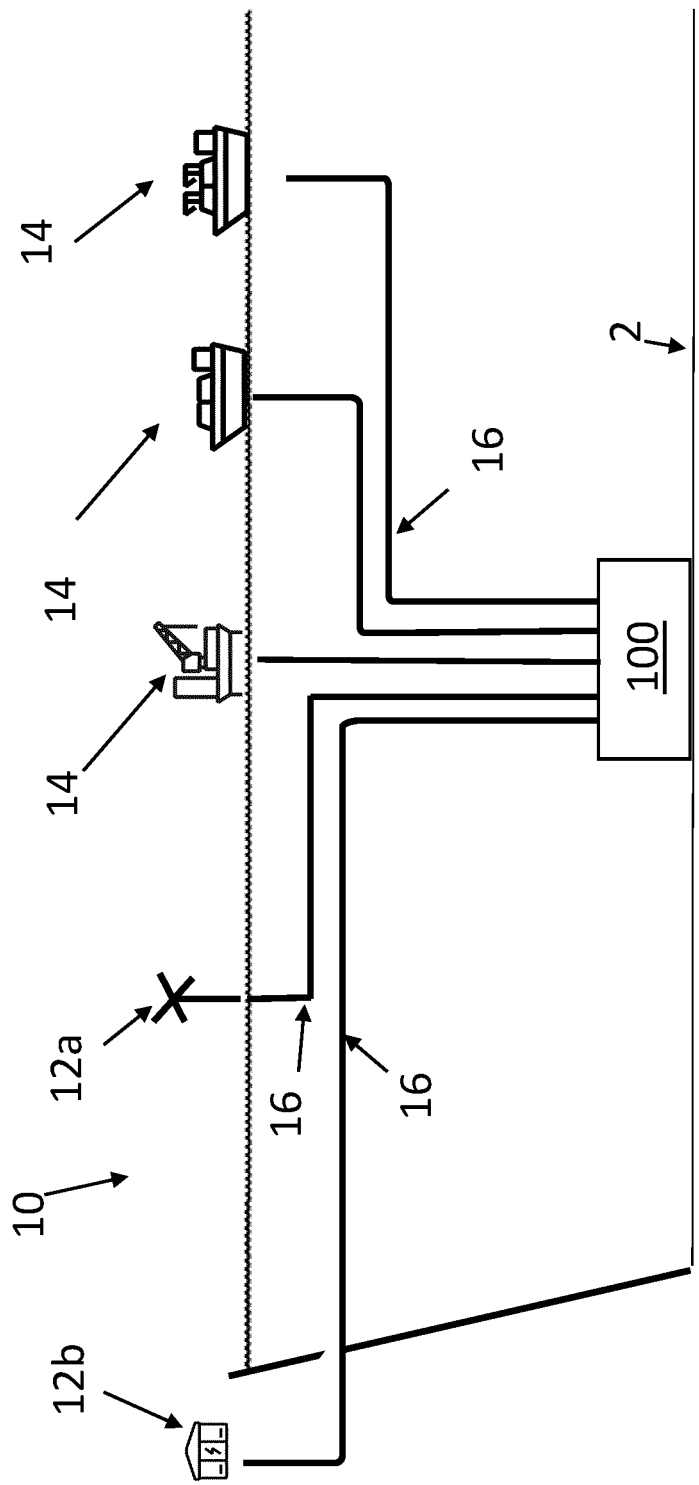
FIG. 1 conceptually illustrates an example power collection system according to embodiments of the invention.

FIG. 1 conceptually illustrates a power collection system 10 for subsea transfer of power from power generation units 12a-b.

The system 10 comprises at least one subsea substation system 100 arranged subsea connected with at least one power generation unit 12a, 12b, to collect electrical power from the power generation units 12a, 12b. The subsea substation system 100 is electrically connected with the power generation units 12a, 12b via subsea cables 16 that extend from the power generation units 12a, 12b to the subsea substation system 100. Further, the subsea substation system 100 is electrically connected with at least one power consumer 14 by a subsea cable 16. The subsea substation system 100 is here shown placed on the seabed 2.

Various types of power consumers are conceivable such as onshore power grids or hubs, offshore power grids or hubs, offshore rigs in need of electrical power, etc. A power consumer may thus be an entity that receives power and distributes the power further, or a direct consumer of the power, or a power storage such as a battery.

The subsea substation system 100 is configured to receive electrical power from at least one power generation unit 12a, 12b, covert the power using an AC-transformer, and provide the converted electrical power to the power consumer 14. The power generation units are here exemplified by an offshore windmill farm 12a and an onshore power station 12b. However, as stated herein, other types of power generation unit are also applicable.

The subsea substation system 100 operate in a harsh environment below sea level and submersed in water, often saltwater. To ensure proper and reliable operation for such subsea substation system 100 and reduce cumbersome maintenance, it is of importance that the electronic components of the subsea substation system 100 are well protected from the surrounding water and should therefore be well enclosed. Further, the subsea substation system 100 must be able to accommodate different types of electronic components with different thermal requirements in a reliable manner.

Figure 2:
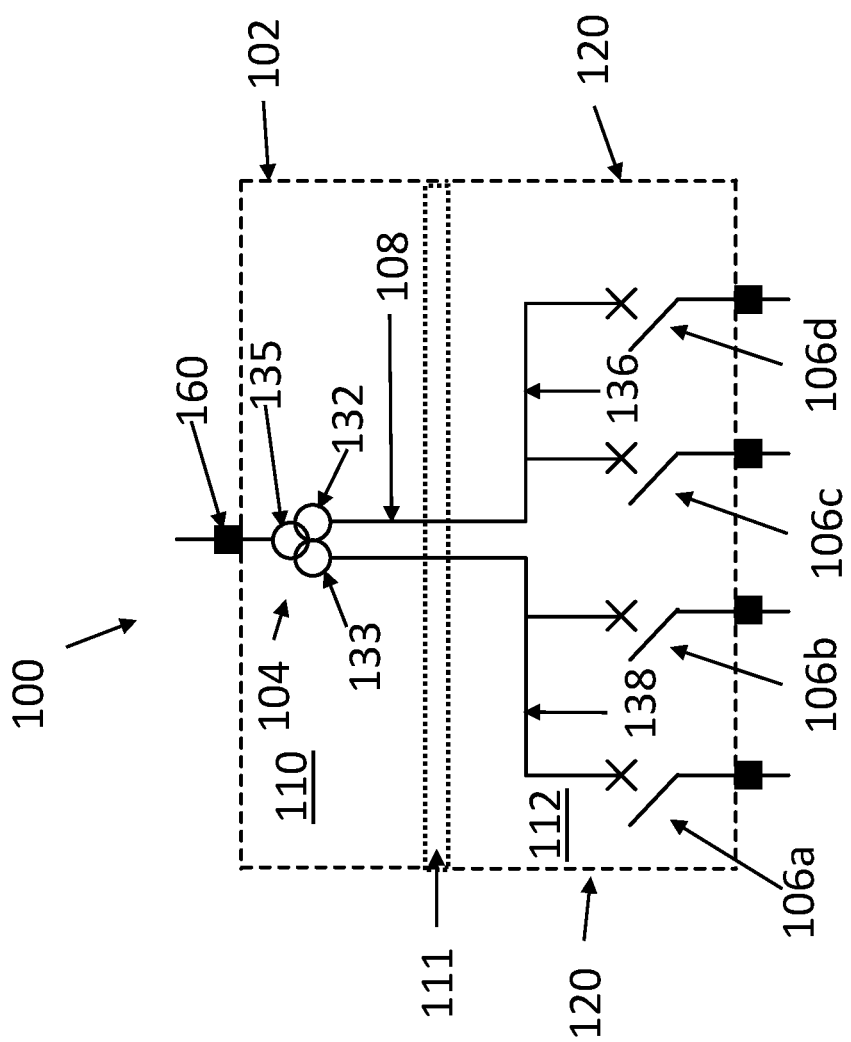
FIG. 2 conceptually illustrates an example subsea substation system according to embodiments of the invention.

To address the above and other challenges of subsea substation systems the inventors propose a subsea substation system 100, of which a first embodiment is conceptually illustrated in FIG. 2.

The subsea substation system 100 comprises an oil-filled water impermeable enclosure 102 configured to allow free movement of oil within the enclosure 102.

The subsea substation system 100 further comprises an AC-transformer 104 and at least one overcurrent device 106a-d electrically connected to the AC-transformer 104. The overcurrent devices 106a-d, the AC-transformer 104, and the electrical connections 108 between them are accommodated in the oil-filled water impermeable enclosure 102. The electrical connections 108 are suitable cables.

Further, the enclosure 102 comprises thermal zones within the enclosure 102. The AC-transformer 104 is arranged in a first thermal zone 110 and the overcurrent devices 106a-d are arranged in a second thermal zone 112 of the enclosure 102. At least one thermal layer 111 separates the first thermal zone 110 and the second thermal zone 112. The thermal layer is configured to allow oil flow between the thermal zones while reducing heat flow between the thermal zones 110 and 112.

The power consumers 14 are connected to the AC-transformer 104 via at least one overcurrent device 106a-d. An overcurrent device is generally configured to isolate faults in the circuit, either at the power consumer side or at the power generating side while keeping the healthy part of the system working and also to de-energize the loads connected to the system.

A thermal layer may be accomplished in various ways and should be interpreted as a means for reducing heat flow at least from the first thermal zone to the second thermal zone. A thermal layer may include a physical entity that provides the effect of reducing heat flow, or it may be provided by other means that provides a virtual thermal layer being in the form of a thermal boundary between the first thermal zone and the second thermal zone. Some examples of enabling a thermal layer are by means of arranging at least one layer of pressboard or wood, of preferably electrically insulating type, between the first and second thermal zone but not in sealing manner. This allows a small amount of oil flow between thermal zones but most of the oil remains in the respective zone.

The flow of oil is preferably only due to convection and suitable thermal guides. However, it may be possible to use pumps or other gears as assisting equipment.

Figure 3A:
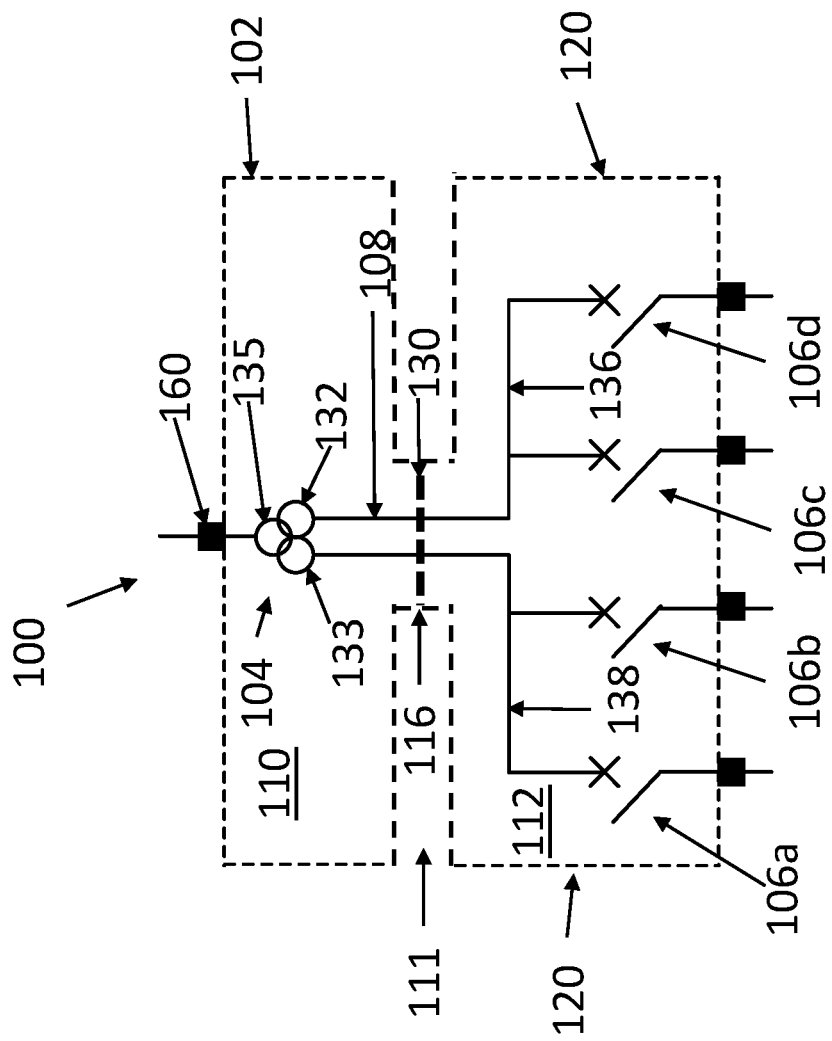
FIG. 3A conceptually illustrates an example subsea substation system according to embodiments of the invention.
Figure 3B:
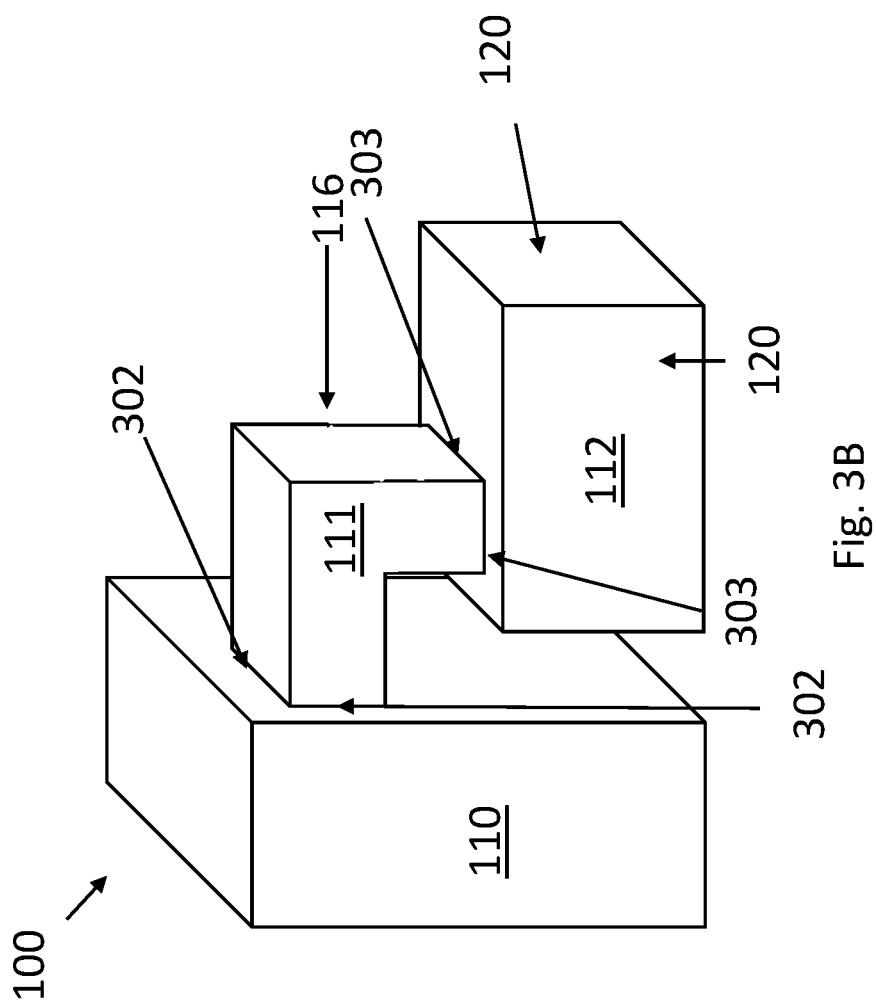
FIG. 3B conceptually illustrates an example subsea substation system according to embodiments of the invention.

FIG. 3A-B conceptually illustrates an embodiment of a subsea substation system 100 where the thermal layer 111 is achieved by means of narrowing the enclosure 102 at one portion thereby forming a passage or sub-volume 116 connecting the first thermal zone 110 and the second thermal zone 112. In this way, the flow of oil can substantially be maintained within each of the thermal zones. The narrowed passage 11 may be provided with e.g., a pressboard or wood layer or another suitable insulating material.

FIG. 3B conceptually illustrates a narrowed sub-volume 116 connected to the first thermal zone 110 and to the second thermal zone 112. The first thermal zone 110 is a first subpart, the second thermal zone 112 is a second subpart, and the sub-volume 116 in the form of a duct is a third subpart of the enclosure 100. Each of the subparts are welded to avoid water leakage into the respective part. The sub-volume 116, the first thermal zone 110, and the second thermal zone 112 is a single volume. Thus, the connection between the connecting duct 116 and the thermal zone 110 is welded at the edge connection 302 (not all are shown), but the interface is open so that oil can flow between the thermal zone 110 and the sub-volume 116. Further, the connection between the connecting duct 116 and the second thermal zone 112 is welded at the edge connection 303 (not all are shown), but the interface is open so that oil can flow between the second thermal zone 112 and the sub-volume 116.

By having the subparts for the first thermal zone 110 and the second thermal zone 112 separated provides for increased surface area in contact with the surrounding water for the respective thermal zone. It is understood that the specific layout of the enclosure 100 may vary, however, placing the first thermal zone horizontally next to the second thermal zone provides for an enclosure 100 that is not excessively high which may be that case if the first thermal zone is stacked with the second thermal zone. Such stacked layout may however have other advantages. That the sub volume 116 connects to the thermal one 110 at a relatively high vertical location is mainly due to advantages from an electrical circuitry layout point of view for connecting the AC-transformer to the overcurrent devices, and to a ground connection.

The sub-volume 116 can be provided with means for circulating the oil in the sub-volume 116 to thereby form a thermal layer. Such means may be thermal guides provided as mechanical plates or other mechanical parts that guide the heated oil away from the overcurrent devices. For example, at least one layer of pressboard or wood, of preferably electrically insulating type may be arranged in the sub-volume 116.

Figure 4B:
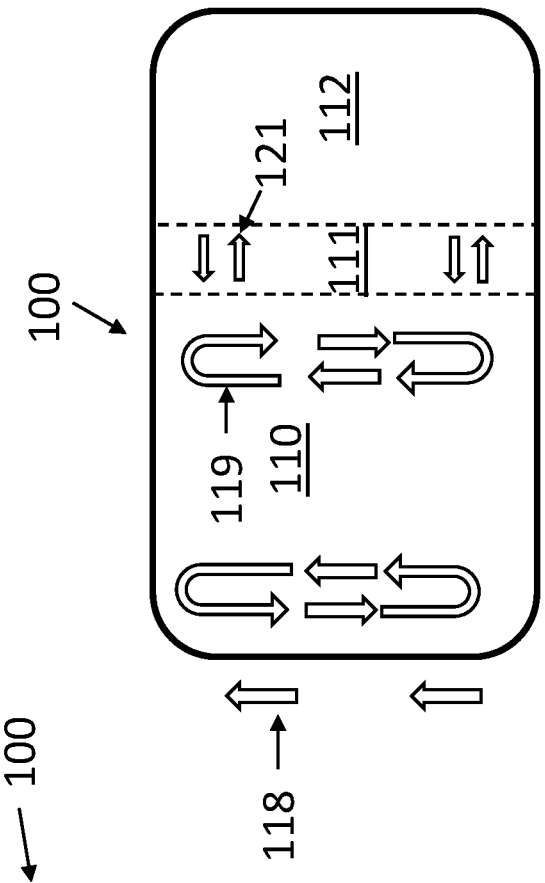
FIG. 4B conceptually illustrates an example subsea substation system in a horizontal arrangement according to embodiments of the invention.
Figure 4A:
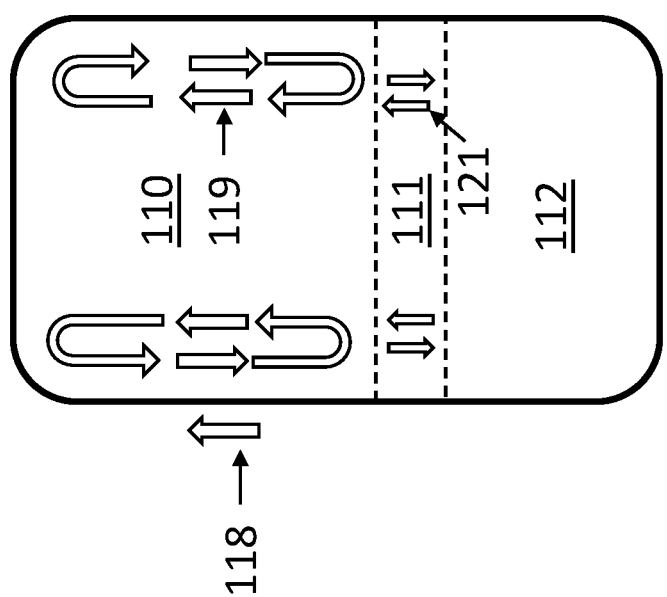
FIG. 4A conceptually illustrates an example subsea substation system in a vertical arrangement according to embodiments of the invention.

FIG. 4A-B conceptually illustrates the formation of two thermal zones 110 and 112. In FIG. 4A, the first thermal zone 110 is located vertically from the second thermal zone 112. The first thermal zone is adapted for accommodating devices such as the AC-transformer 104 tolerating higher temperatures than what the second thermal zone is adapted for. The devices accommodated in the second thermal zone includes the overcurrent devices 106a-d.

In the vertical arrangement shown in FIG. 4A the warm oil naturally flows, indicated by arrows 119 inside the enclosure 100, towards or is maintained in the first thermal zone 110 where the AC-transformer is located which has a much higher operating temperature than the overcurrent devices located in the second thermal zone 112. In other words, as oil warms up, it flows in the vertical direction 118 and causes thermal flow in the vertical direction indicated by arrow 118. Further, a mechanical barrier is arranged in the thermal layer 111 such that the heated oil is at least to the most part maintained in the first thermal zone 110. Thus, the warmest oil maintained in the most vertically located first thermal zone 110. The mechanical barrier may guide the heated oil in the first thermal zone 110 towards the enclosure walls. Some oil is allowed to transfer between the zones as indicated by arrows 121.

In the horizontal arrangement shown in FIG. 4B the oil flow is guided in the thermal layer 111 towards the enclosure walls by mechanical thermal guides or barriers. Further, in thermal guides or barriers in the first thermal zone 110, or in the thermal layer 111 guides heated oil towards the enclosure walls. The thermal layer is thus intact so that heat flow is only allowed to some extent between the first thermal zone 110 and the second thermal zone 112.

Figure 5D:
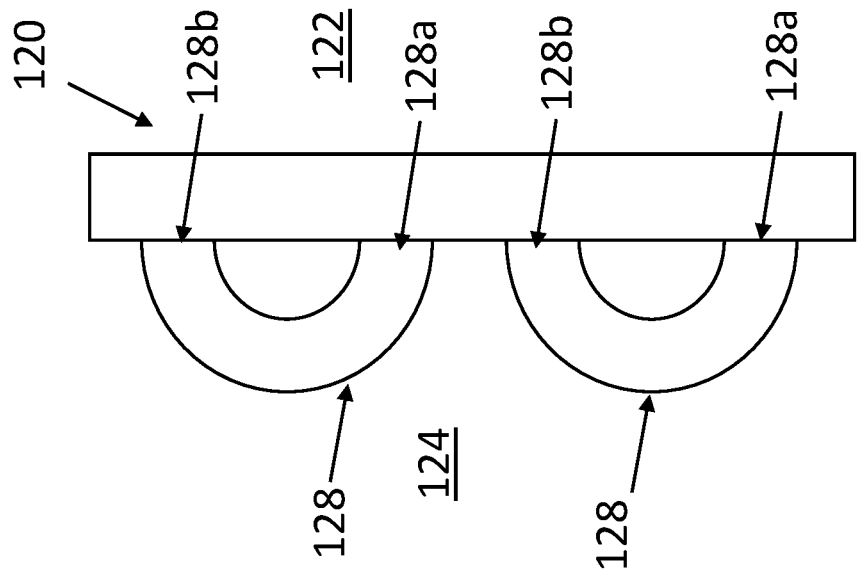
FIG. 5D conceptually illustrates example heat dissipators according to embodiments of the invention.
Figure 5C:
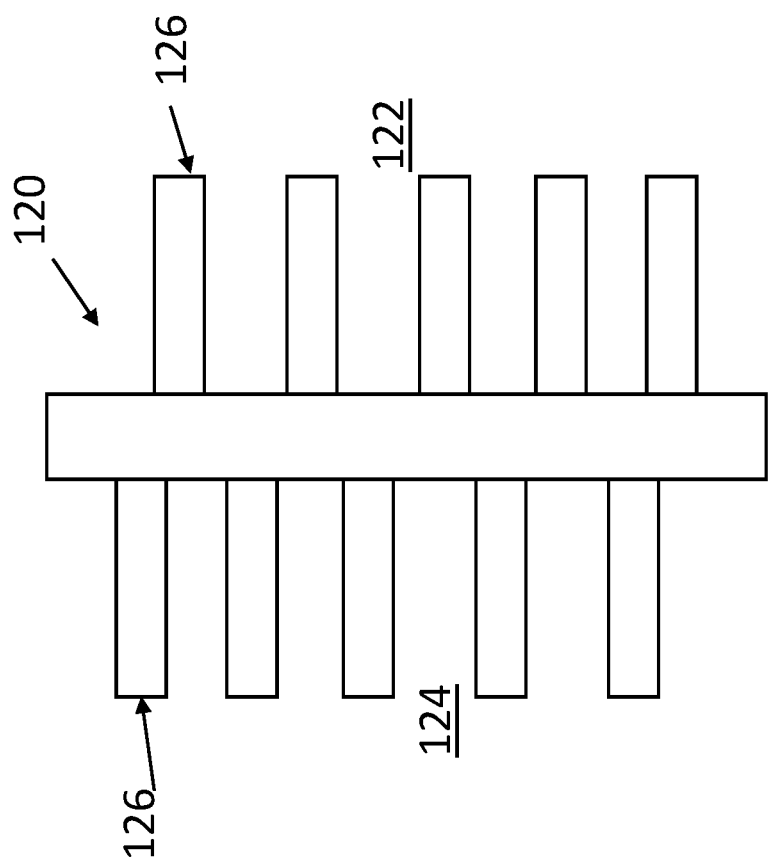
FIG. 5C conceptually illustrates example heat dissipators according to embodiments of the invention.

FIG. 5A-C conceptually illustrates a wall portion 120 of an enclosure 102 and also indicating the inner side 122 of the enclosure housing oil and the outer side 124 of the enclosure 102 where water is in contact with the enclosure 102.

The enclosure here comprises heat dissipators in the form of flanges on the wall. In FIG. 5A, the heat dissipators, flanges 126, are located on the outer side 124 in contact with water. In FIG. 5B, the heat dissipators, flanges 126, are located on the inner side 122 in contact with oil. In FIG. 5C, the heat dissipators, flanges 126, are located on the inner side 122 in contact with oil and on the outer side 124 in contact with water.

The heat dissipators may be associated with at least one of the first and second thermal zones meaning that they are arranged either in the specific thermal zone inside the enclosure such as shown in FIG. 5B where the flanges 126 are arranged on the oil side 122, and/or on the opposite side of the wall on the water side 124 as shown in FIG. 5A. In FIG. 5C, the flanges 126 are arranged on both the water-, wet side 124 and on the inner oil side 122. The at least one heat dissipator 126 is adapted to exchange heat with the surrounding water of the subsea substation system when being arranged at a subsea location.

The at least one heat dissipator, such as flanges 126, effectively increase the surface area of the wall portion 126 of the respective thermal zone of the enclosure. Preferably, the heat dissipators are arranged in the second thermal zone 112. The size and dimension of the flanges 126 may be tailored for a specific implementation at hand.

Here, in FIGS. 5A-C, the heat dissipators are shown in the form of flanges 126, however, other types of heat dissipators are also conceivable such as other structures forming a rough or rugged surface that increases the surface area. Further, as shown in FIG. 5D, piping 128 with an inlet 128a and an outlet 128b in a wall 120 of the enclosure that leads oil through the water 124 may also be used as heat dissipator. The piping 128 increases the surface area of the enclosure that is in contact with water 124. Preferably multiple pipes 128 are arranged on the outer side of the enclosure 102. Further, the heat dissipator may be provided in the form of indentations or valleys that protrude inwards in the wall portion 120 towards the oil side 122 to thereby increase the surface area of the wall portion 120.

With reference to for example FIG. 3A, an electromagnetic shielding layer 130 is preferably arranged between the thermal zones 110 and 112. Such electromagnetic shielding layer 130 is an electrically conductive mesh such as a metallic mesh comprising e.g., copper or any other suitable metal. A mesh may be a perforated sheet of metal. With the electromagnetic shielding layer the effect of disturbances from the AC-transformer 104 to the overcurrent devices 106a-d is reduced. Further the effect of disturbances from the overcurrent devices 106a-d to the AC-transformer 104 is reduced.

Preferably, the AC-transformer is operative at at least 6 kV AC at the secondary side and at at least 11 kV AC at the primary side. The high voltage side is the side of the power generating units 12a-b and the opposite side, the side of the power consumer 14 is the low voltage side. For the intended purpose of collecting power from power generating units, the AC-transformer should be operative at these relatively high voltages. For the same reasons, the at least one overcurrent device is configured to operate at voltage levels of 6 kV to 250 kV and breaking high fault currents of at least 16 kA.

The AC-transformer 104 described herein, such as shown in e.g., FIG. 2 or 3A, comprises at least secondary winding 132, 133 and at least one primary winding 135 on the high voltage side. Preferably, the AC-transformer 104 comprises multiple windings, and in there herein illustrated examples, the AC-transformer 104 comprises two secondary windings 132, 133, although more than two secondary windings is also conceivable.

The secondary winding 132, 133 is electrically connected to at least one overcurrent device 106a-d. For example, the secondary winding 132 indicated in FIG. 2, is electrically connected through electrical connections 136 to overcurrent devices 106c-d that may be considered a first set of overcurrent devices 106c-d. The secondary winding 133 is electrically connected through electrical connections 138 to overcurrent devices 106a-b that may be considered a second set of overcurrent devices 106a-b.

Figure 6:
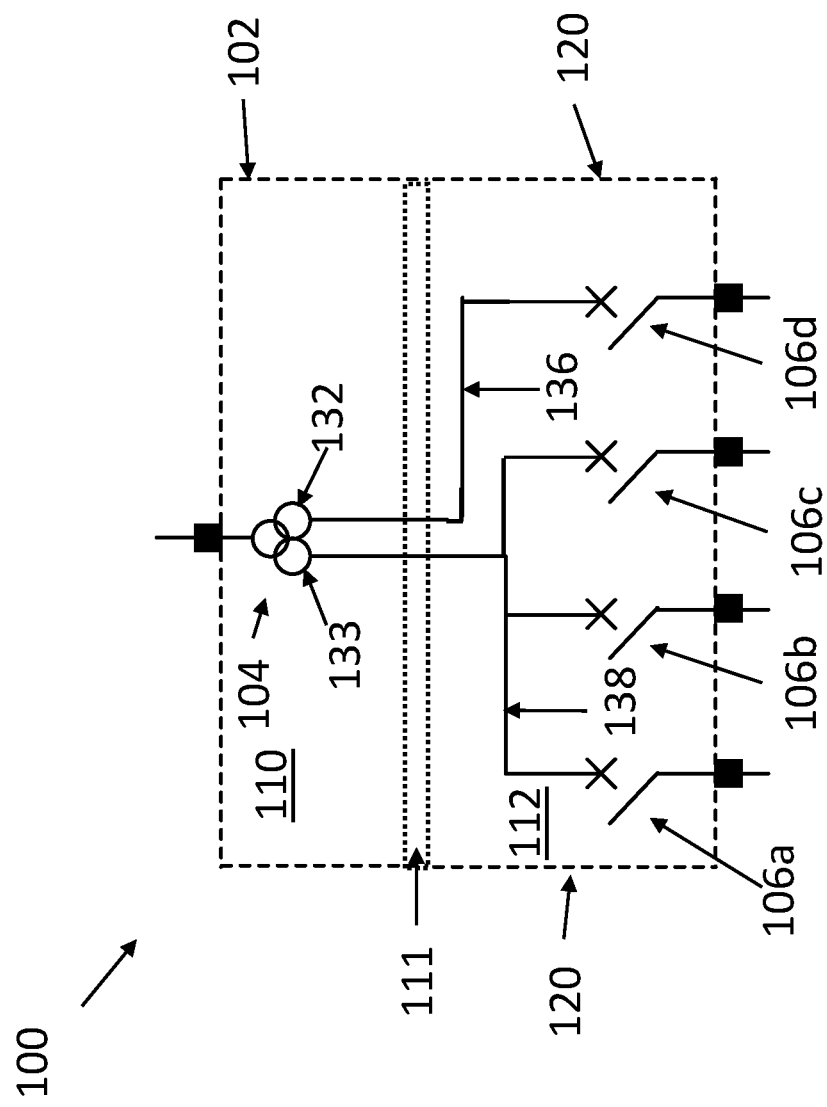
FIG. 6 conceptually illustrates an example subsea substation system according to embodiments of the invention.

Turning to FIG. 6, in some embodiments, one secondary winding 132 is electrically connected through electrical connections 136 to a single overcurrent devices 106d. The secondary winding 133 is electrically connected through electrical connections 138 to more than two overcurrent devices 106a-c that may be considered a second set of overcurrent devices 106a-c.

In some embodiments, the overcurrent devices 106a-d are equipped 5 with sensors configured to detect faults in the enclosure and disconnect an electrical circuit associated with the overcurrent device 106a-d. The sensors could be voltage sensors measuring a voltage on a transformer secondary winding and/or in the connection between switch 166 and e.g., overcurrent device 106a, corresponding current sensors, temperature sensors measuring the temperature in the oil within the enclosure in specific points such as nearby the transformer, near the overcurrent devices and critical electrical connection points, insulation measurement sensors adapted to perform high impedance detection measurements in the outputs of the overcurrent devices or in the transformer neutral, water leakage sensors adapted to measure the capacitance variation in the oil. Water leakage sensors are preferably placed in the lower parts of an oil filled enclosure where the water would accumulate. For specific loads the sensors could be installed as a single sensor or a pair of redundant sensors.

Figure 7:
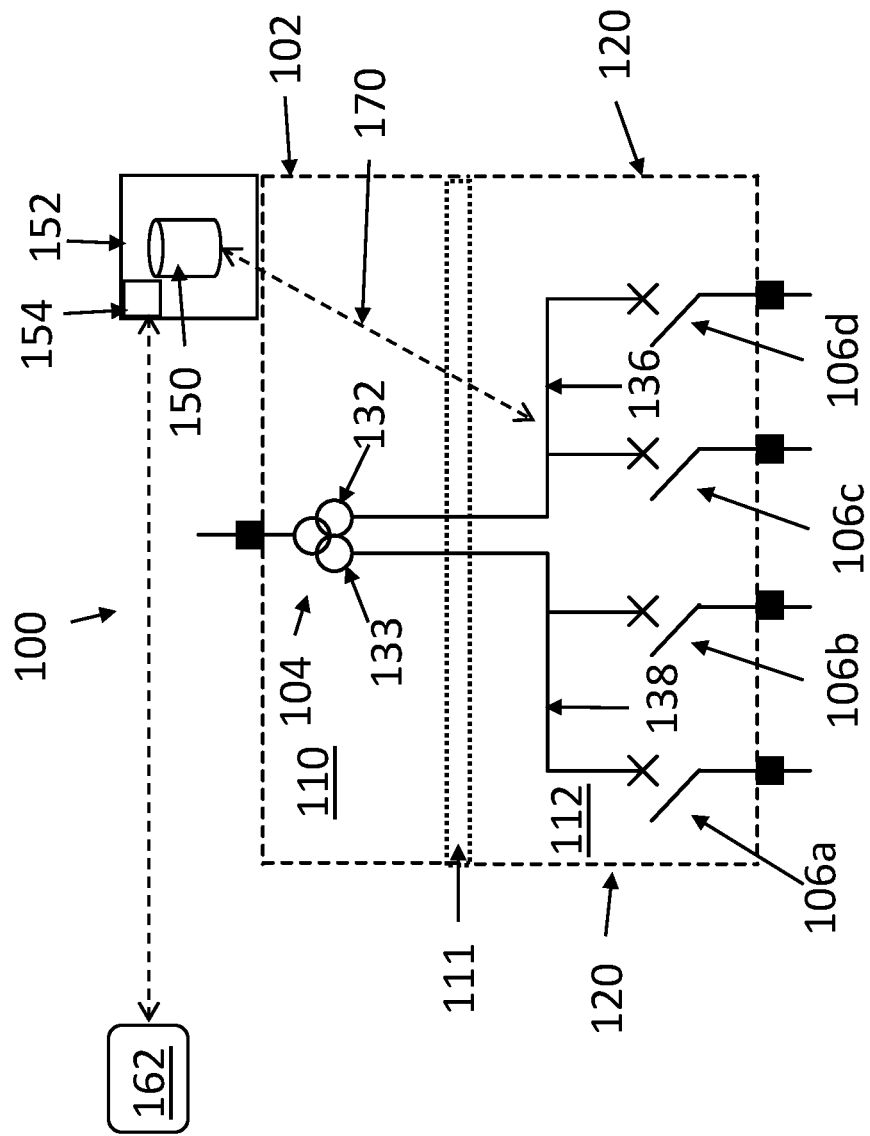
FIG. 7 conceptually illustrates an example subsea substation system according to embodiments of the invention.

FIG. 7 conceptually illustrates a further embodiment of the present invention comprising control unit 150 configured to receive signals from the sensors of the overcurrent devices 106a-d indicative of the type of faults discussed above. In response to a signal from the sensor indicating a fault, the control unit 150 is configured to provide control signals via a wireless or preferably hardwired connection 170 to the overcurrent devices 106a-d to control the operation of the overcurrent devices 106a-d.

Preferably, the control unit 150 is arranged in a separate water impermeable enclosure 152 to make it easier to retrieve it from the subsea environment without having to open the oil-filled enclosure 102.

The subsea substation system 100 further comprises a communication arrangement 154 belonging to the enclosure 152 in which the control unit 150 is arranged. The communication arrangement 154 is configured to allow remote control of the control unit 150, and to acquire data indicative of the operation status of the AC-transformer 104 and overcurrent devices 106a-d. Remote control may be performed by a client 162 onshore.

Figure 8:
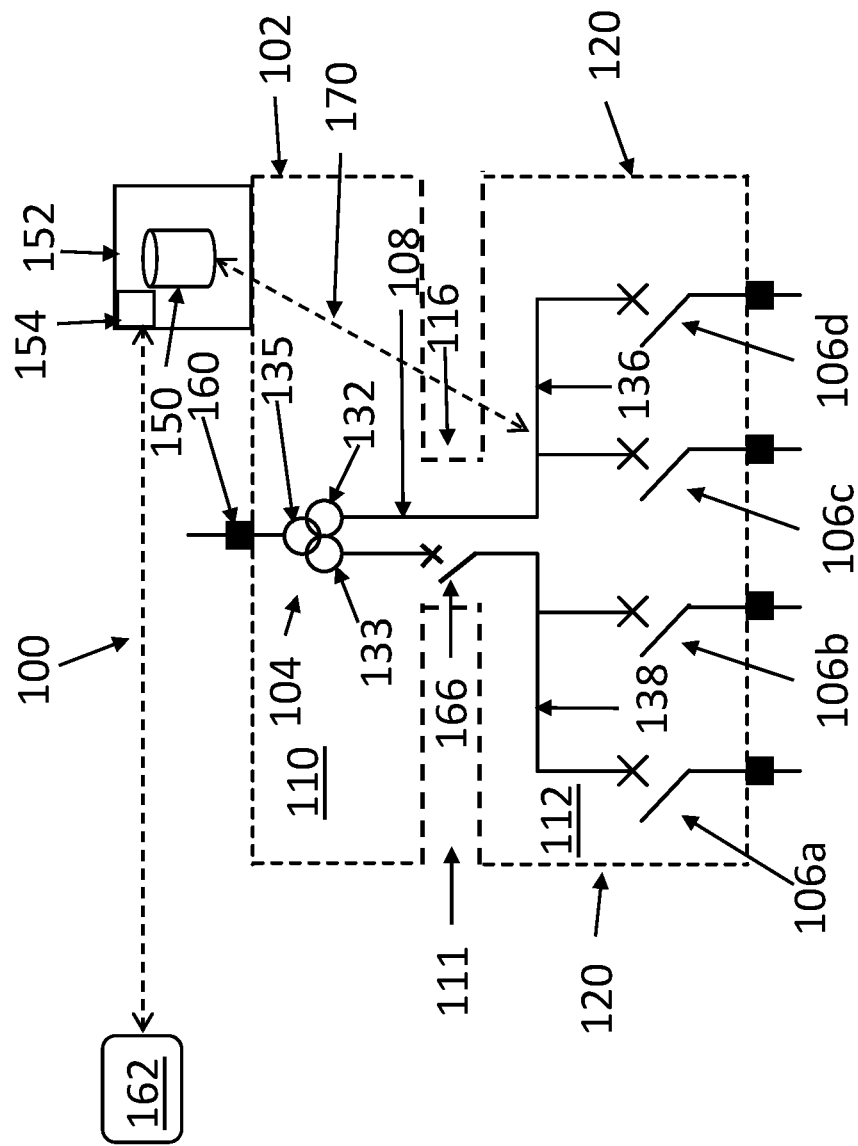
FIG. 8 conceptually illustrates an example subsea substation system according to embodiments of the invention.

As is conceptually illustrated in FIG. 8, a controllable switch or circuit breaker 166 may be arranged electrically between the secondary winding and at least one overcurrent device 106a-b. The switch 166 is configured to control the electrical connection between the secondary winding 133 and at least one overcurrent device 106a-b between an open state and a closed state. The switch 166 may be remotely controlled by a client 162 using the communication arrangement 154. The communication arrangement 154 may be based on e.g., Ethernet or similar.

Preferably, the AC-transformer and the at least one overcurrent device are operated in contact with oil.

The overcurrent device is configured to control the electrical connection between the production unit and a power consumer, in other words, an overcurrent device can break or reconnect the electrical connection between the production unit and a power consumer.

Generally, the AC-transformer has a longer operating lifetime than the overcurrent devices. This means that it would be desirable to increase the lifetime of the overcurrent devices to increase the time before failure inside the enclosure. One way to achieve this is to reduce the number of mechanical parts. For this, the overcurrent devices preferably comprise magnetic actuators configured to control the connection to the AC-transformer.

Further, the connections 160 on the outer side of the enclosure 102, see e.g., FIG. 2 may be a wet-mated connector electrically connected to the AC-transformer and to the at least one overcurrent device, to allow connection with an external electrical arrangement via a subsea cable. However, also dry-mated electrical connections are applicable.

A control unit may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device.

Communication between devices, control units or other modules described herein may be wireless or hardwired, based on electrical and/or fiber-optical communication as is suitable and implement a suitable protocol for the specific case.

Even though the invention has been described with reference to specific exemplifying embodiments thereof, many different alterations, modifications and the like will become apparent for those skilled in the art.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A subsea substation system comprising:
an oil-filled water impermeable enclosure;
an AC-transformer, and
at least one overcurrent device electrically connected to the AC-transformer, the at least one overcurrent device, the AC-transformer, and the electrical connections between them are accommodated in the oil-filled water impermeable enclosure, wherein
the enclosure comprises thermal zones within the enclosure, wherein the AC-transformer is arranged in a first thermal zone and the overcurrent devices are arranged in a second thermal zone of the enclosure, wherein a mechanical barrier made from at least one sheet of wood or pressboard form a thermal layer that separates the first thermal zone and the second thermal zone, the mechanical barrier is not sealed against walls of the enclosure, wherein the at least one thermal layer is configured to allow oil flow between the thermal zones in areas between the walls of the enclosure and the mechanical barrier that is sufficiently low such that the first thermal zone differs from the second thermal zone with respect to temperature.

2. The subsea substation system according to claim 1, further comprising at least one heat dissipator connected to a respective wall of at least one of the first and second thermal zones, the at least one heat dissipator is adapted to exchange heat with the surrounding water of the subsea substation system when being arranged at a subsea location.

3. The subsea substation system according to claim 2, wherein the at least one heat dissipator is provided as a pipe or protruding hollow structure connected to the walls of the enclosure to increase the surface area of a wall portion of the respective thermal zone of the enclosure.

4. The subsea substation system according to claim 1, wherein the first thermal zone is located vertically from the second zone.

5. The subsea substation system according to claim 1, further comprising an electromagnetic shielding layer between the thermal zones.

6. The subsea substation system according to claim 1, wherein the AC-transformer is operative at least 6 kV AC at the secondary side and at least 11 kV AC at the primary side.

7. The subsea substation system according to claim 1, wherein the at least one overcurrent device is configured to operate at voltage levels of 6 kV to 250 kV and breaking high fault currents of at least 16 kA.

8. The subsea substation system according to claim 1, wherein the first thermal zone is adapted for accommodating devices tolerating higher temperatures than what the second thermal zone is adapted for.

9. The subsea substation system according to claim 1, wherein the AC-transformer comprises at least one secondary winding connected to the at least one overcurrent device.

10. The subsea substation system according to claim 1, wherein each of the overcurrent devices is equipped with sensors configured to detect at least one of electrical faults, insulation faults, temperature faults or water leakage in the enclosure and disconnect an electrical circuit of the subsea substation system connected with the overcurrent device.

11. The subsea substation system according to claim 10, further comprising a control unit configured to receive signals from the sensors indicative of the faults, and to control the operation of the at least one overcurrent device in response to the received signal.

12. The subsea substation system according to claim 11, comprising a communication arrangement configured to allow remote control of the control unit, and to acquire data indicative of the operation status of the AC-transformer.

13. The subsea substation system according to claim 1, wherein the AC-transformer and the at least one overcurrent device are configured to operate in contact with oil.

14. The subsea substation system according to claim 1, wherein the overcurrent device comprises a magnetic actuator configured to control a connection to the AC-transformer.

15. A power collection system for subsea collection of power from at least one power generation unit, the system comprising:
at least one power generation unit; and
at least one subsea substation system having an oil-filled water impermeable enclosure;
an AC-transformer, and
at least one overcurrent device electrically connected to the AC-transformer, the at least one overcurrent device, the AC-transformer, and the electrical connections between them are accommodated in the oil-filled water impermeable enclosure, wherein
the enclosure comprises thermal zones within the enclosure, wherein the AC-transformer is arranged in a first thermal zone and the overcurrent devices are arranged in a second thermal zone of the enclosure, wherein a mechanical barrier made from at least one sheet of wood or pressboard form a thermal layer that separates the first thermal zone and the second thermal zone, the mechanical barrier is not sealed against walls of the enclosure, wherein the at least one thermal layer is configured to allow oil flow between the thermal zones in areas between the walls of the enclosure and the mechanical barrier that is sufficiently low such that the first thermal zone differs from the second thermal zone with respect to temperature, arranged subsea connected with the at least one power generation unit to collect electrical power from the at least one power generation unit, the at least one subsea substation system being electrically connected with the power generation unit and to a power consumer by at least one subsea cable of the power collection system.

16. The subsea substation system according to claim 2, wherein the first thermal zone is located vertically from the second zone.

17. The subsea substation system according to claim 2, further comprising an electromagnetic shielding layer between the thermal zones.

18. The subsea substation system according to claim 2, wherein the AC-transformer is operative at least 6 kV AC at the secondary side and at least 11 KV AC at the primary side.

19. The subsea substation system according to claim 2, wherein the at least one overcurrent device is configured to operate at voltage levels of 6 kV to 250 kV and breaking high fault currents of at least 16 kA.

20. The subsea substation system according to claim 2, wherein the first thermal zone is adapted for accommodating devices tolerating higher temperatures than what the second thermal zone is adapted for.

* * * * *